(12) United States Patent
Tsuchida et al.

(10) Patent No.: US 8,431,070 B2
(45) Date of Patent: Apr. 30, 2013

(54) MOLD FORMING AND MOLDING METHOD

(75) Inventors: Masahiro Tsuchida, Shiga (JP); Shigeru Goto, Shiga (JP); Kentaro Okushima, Shiga (JP); Muneyoshi Yamatani, Shiga (JP)

(73) Assignee: KYOCERA Corporation, Kyoto (JP)

( * ) Notice: Subject to any disclaimer, the term of this patent is extended or adjusted under 35 U.S.C. 154(b) by 420 days.

(21) Appl. No.: 12/392,857

(22) Filed: Feb. 25, 2009

(65) Prior Publication Data

US 2009/0159230 A1 Jun. 25, 2009

Related U.S. Application Data

(63) Continuation-in-part of application No. PCT/JP2007/066892, filed on Aug. 30, 2007.

(30) Foreign Application Priority Data

Aug. 30, 2006 (JP) ................................. 2006-233661

(51) Int. Cl.
*B28B 1/14* (2006.01)

(52) U.S. Cl.
USPC ........................................................ 264/683

(58) Field of Classification Search ............... 264/683
See application file for complete search history.

(56) References Cited

U.S. PATENT DOCUMENTS

| 7,077,991 B2 * | 7/2006 | Wan et al. ..................... 264/405 |
| 2007/0240635 A1 * | 10/2007 | Rancoule ........................ 117/208 |
| 2008/0196656 A1 * | 8/2008 | Rancoule ........................ 117/206 |

FOREIGN PATENT DOCUMENTS

| JP | 07-100352 | 4/1995 |
| JP | 09-175809 | 7/1997 |
| JP | 2002-239682 | 8/2002 |
| JP | 2004-291029 | 10/2004 |
| JP | 2007-261832 | 10/2007 |

OTHER PUBLICATIONS

Brown et al., "The pyrolysis of cellulose derivatives". Journal of Applied Polymer Science. vol. 22, Issue 6, pp. 1459-1468, Jun. 1978.*
Machine Translation of JP 2004-291027.*
Machine Translation of JP 2002-239682.*
15th Photovoltaic Specialists Conference—1981, P576-P580, "A New Directional Solidification Technique for Polycrystalline Solar Grade Silicon", Takeshi Saito et al.

* cited by examiner

*Primary Examiner* — Joseph Del Sole
*Assistant Examiner* — Russell Kemmerle, III
(74) *Attorney, Agent, or Firm* — Procopio, Cory, Hargreaves & Savitch LLP

(57) ABSTRACT

A mold forming and molding technology operable to produce a silicon ingot suitable for obtaining a solar cell substrate is disclosed. A slurry is prepared comprising particles with surface oxide layers operable to bond the particles to each other. An external force is applied to the slurry to eliminate cohesion of the particles to form a de-cohesive slurry, and an inner surface of a mold base is coated with the de-cohesive slurry to form a releasing layer that reduces defects in the silicon ingot.

19 Claims, 9 Drawing Sheets

300

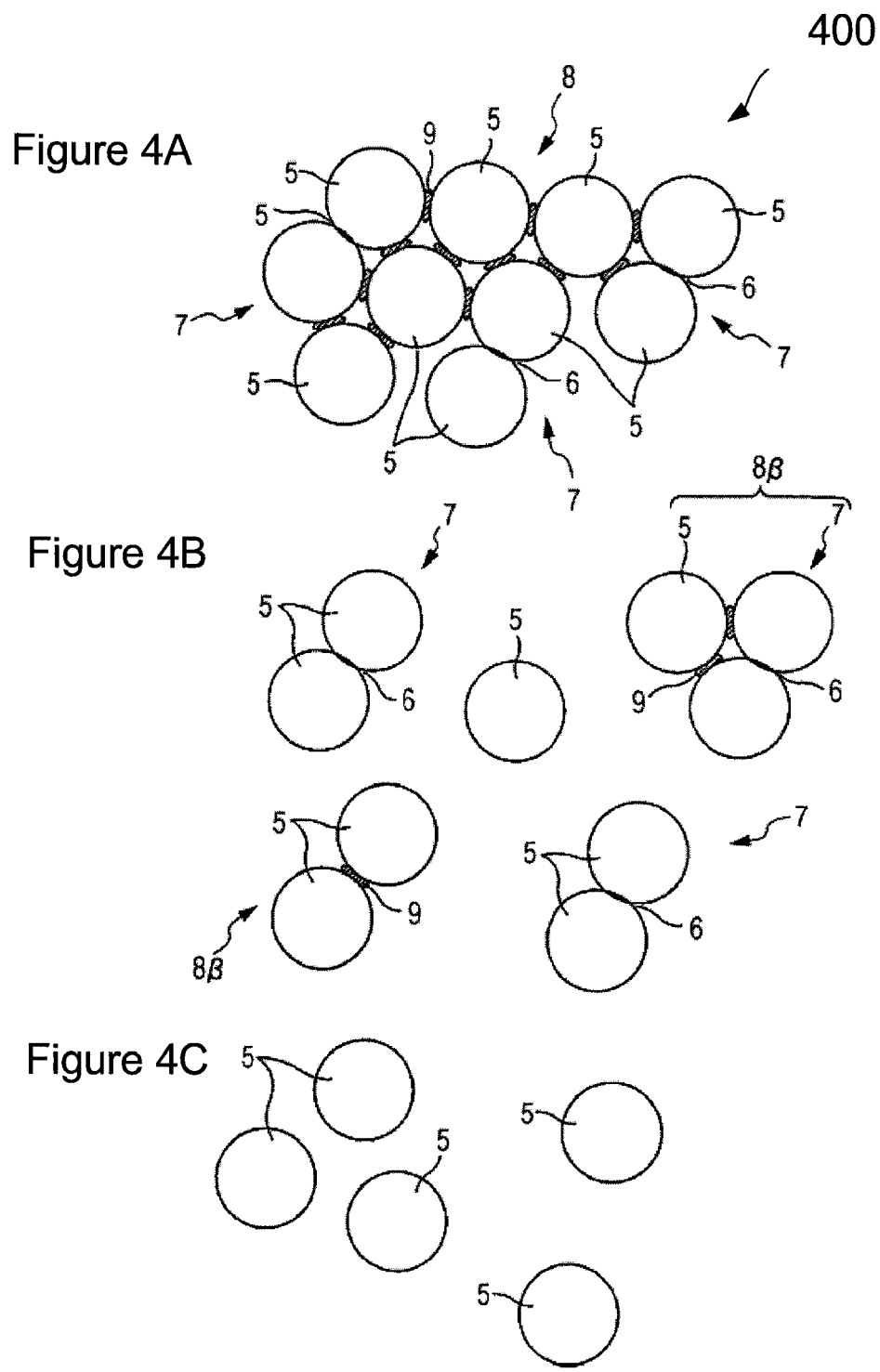

MOLD FORMING AND MOLDING METHOD

CROSS-REFERENCE TO RELATED APPLICATION

This application is a continuation in part based on PCT application PCT/JP2007/066892 filed on Aug. 30, 2007, which claims the benefit of Japanese national application JP2006-233661 filed on Aug. 30, 2006, the entirety of both of which are incorporated by reference herein.

FIELD OF INVENTION

Embodiments of the present disclosure relate generally to manufacturing of a solar cell element, and more particularly relate to a mold used for manufacturing a silicon ingot for providing a substrate for a solar cell element.

BACKGROUND OF THE INVENTION

Polycrystalline silicon substrates are a type of a semiconductor substrate that have been used for forming solar cell elements. Polycrystalline silicon substrates are obtained by slicing a silicon ingot. The silicon ingot may be produced by, for example, a method of feeding melted silicon into a mold and solidifying the silicon. The silicon ingot may also be produced by a method of melting a silicon material in a mold and solidifying the resultant silicon melt in the mold. Silicon generally melts at a temperature of about 1414° C.

When a silicon ingot is produced by the methods described above, a mold is generally used that has a releasing layer composed of a carbon material or a silica material on the inner surface of the base of the mold. Typically, the releasing layer is composed of a powder of silicon nitride ($Si_3N_4$), silicon carbide (SiC), silicon dioxide ($SiO_2$), or the like.

In the past a technique for forming the releasing layer has been used, in which these powders are mixed with a solution composed of a certain binder and a solvent to form a slurry. The inner surface of a mold base is then coated with the slurry by spraying to form a releasing layer over the inner surface of the mold base. A dispersing apparatus has also been used for mixing and dispersing solid particles by the rotor-stator principle in a fluid being dispersed.

A releasing layer formed from the silicon nitride powder has a weak adhesion to a mold base and the strength of the releasing layer is low. For this reason, portions of the releasing layer can flake off from the mold base and, as a result, a silicon melt can come into contact with and fuse with the inner surface of the mold base. When a silicon melt fused with the mold in this way is solidified and cooled in the mold, the difference in thermal shrinkage between the material of the mold base and silicon causes flaws in the silicon ingot. Examples of flaws are cracking of the silicon ingot, incapability of releasing the silicon ingot from the mold (i.e., the molded silicon ingot gets stuck in the mold), and chipping of the silicon ingot occurring during releasing of the silicon ingot from the mold.

Furthermore, when matter flaked off from a releasing layer enters a silicon ingot, a silicon substrate (wafer) obtained by slicing the ingot can contain the flaked matter as foreign matter. This can increase the proportion of rejected silicon substrates, and can cause breakage of a wire of a wire saw during slicing of a silicon ingot with the wire saw.

To overcome such problems, it has been proposed that a releasing layer be formed with a slurry containing silicon nitride powder in which each powder particle has an oxide layer with a thickness of 1 nm or more over the surface of the particle. Such oxide layers are formed by subjecting silicon nitride powder to an oxidation modification treatment. A releasing layer formed by this method can have an enhanced strength because the oxide layers on the surfaces of silicon nitride particles are softened and the silicon nitride particles can be bonded to one another. When bulky particles or clusters of particles such as cohered particles or fused particles are present in a releasing layer and are too large, flaking of the releasing layer may not be sufficiently suppressed. For this reason, the size of bulky particles or particle clusters may need to be reduced by controlling the thickness of the oxide layers of silicon nitride particles or the average particle size, including the thickness of an oxide layer, of silicon nitride particles.

Although use of the above method can enhance the strength of a releasing layer, generation of bulky particles or particle clusters may not be completely suppressed. The bulky particles or particle clusters form because oxide layers on the surfaces of silicon nitride particles are bonded or fused to one another in the standby period prior to the slurry coating of a mold base. Thus, the possibility that bulky particles or particle clusters flake and enter a silicon melt continues to exist when manufacturing a silicon ingot. When a mold base is coated with a slurry, cohered particles may exist on the surface of the resultant releasing layer, and hence, may prevent formation of a releasing layer with high flatness. When such bulky particles or particle clusters of a releasing layer flake and enter a silicon melt, most of the particles are melted in the silicon melt, but some particles may not be melted and may remain as small particles (fine particles) in the resultant silicon ingot. When a solar cell element is manufactured from a silicon substrate obtained by slicing a silicon ingot containing such fine particles, the fine particles may cause a leak current, which degrades the properties of the solar cell element. In addition to this, since the solar cell element is defective due to leakage, the process yield is decreased. Accordingly, there is a need for methods of manufacturing solar cell elements that reduce the presence of releasing layer flakes and particles.

SUMMARY

A mold forming and molding technology operable to produce a silicon ingot suitable for obtaining a solar cell substrate is disclosed. A slurry is prepared comprising particles with surface oxide layers operable to bond the particles to each other. An external force is applied to the slurry to eliminate cohesion of the particles to form a de-cohesive slurry, and an inner surface of a mold base is coated with the de-cohesive slurry to form a releasing layer that reduces defects in the silicon ingot.

A first embodiment comprises a method of forming a mold for producing a silicon ingot. The method comprises preparing a first slurry comprising surface-oxidized particles, wherein at least some of the surface-oxidized particles are cohered particles. The method also comprises eliminating cohesions of the cohered particles in the first slurry by applying an external force to the cohered particles to obtain a second slurry. The method further comprises forming a releasing layer by coating an inner surface of a mold base with the second slurry.

A second embodiment comprises a method of manufacturing a solar cell element. The method comprises preparing a first slurry comprising surface-oxidized particles, wherein at least some of the surface-oxidized particles are cohered particles. The method also comprises eliminating cohesions of the cohered particles by applying an external force to the cohered particles to obtain a second slurry. The method further comprises forming a releasing layer by coating an inner surface of a mold base with the second slurry, and producing a silicon ingot by solidifying a silicon melt in a mold comprising the mold base and the releasing layer.

A third embodiment comprises a mold for producing a silicon ingot. The mold comprises a mold base, and a releasing layer. The mold is formed by preparing a first releasing agent slurry comprising surface-oxidized particles, wherein at least some of the surface-oxidized particles are cohered particles. The mold is further formed by decohesioning the cohered particles by applying an external force to the cohered particles to obtain a second releasing agent slurry, and forming the releasing layer by coating the inner surface of the mold base with the second slurry.

BRIEF DESCRIPTION OF THE DRAWINGS

Embodiments of the present disclosure are hereinafter described in conjunction with the following figures, wherein like numerals denote like elements. The figures are provided for illustration and depict exemplary embodiments of the disclosure. The figures are provided to facilitate understanding of the disclosure without limiting the breadth, scope, scale, or applicability of the disclosure. The drawings are not necessarily made to scale.

FIGS. 4A-4C are schematic illustrations of a change of state of a silicon nitride powder in a slurry according to an embodiment of the disclosure.

DETAILED DESCRIPTION OF EXEMPLARY EMBODIMENTS

The following description is presented to enable a person of ordinary skill in the art to make and use the embodiments of the disclosure. The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the invention. Furthermore, there is no intention to be bound by any expressed or implied theory presented in the preceding technical field, background, brief summary or the following detailed description. The present disclosure should be accorded scope consistent with the claims, and not limited to the examples described and shown herein.

Embodiments of the disclosure are described herein in the context of one practical non-limiting application, namely, forming a mold to produce a silicon ingot suitable for obtaining a solar cell substrate. Embodiments of the disclosure, however, are not limited to such solar cell applications, and the techniques described herein may also be utilized in other applications of molds and substrates. For example, embodiments may be applicable to forming other semiconductor substrates.

As would be apparent to one of ordinary skill in the art after reading this description, these are merely examples, and the embodiments of the disclosure are not limited to operating in accordance with these examples. Other embodiments may be utilized and structural changes may be made without departing from the scope of the exemplary embodiments of the present disclosure.

The device described herein is one example embodiment of the disclosure. Embodiments of the present disclosure may be practiced with other materials or structures. For the sake of brevity, conventional techniques and components related to mold forming and molding technology, producing a silicon ingot, obtaining a solar cell substrate, and a solar cell element may not be described in detail herein.

A mold forming and molding technology operable to produce a silicon ingot suitable for obtaining a solar cell substrate is disclosed. A slurry preparation step prepares a first slurry containing a large number of particles with surface oxide layers operable to bond the particles to each other. A de-cohesion step eliminates cohesion of the particles by applying an external force to obtain a second slurry, and a releasing layer formation step forms a releasing layer by coating an inner surface of a mold base with the second slurry. Hereinafter, embodiments of the present invention are described in detail with the accompanying drawings.

Mold for Producing Silicon Ingot and Method for Forming the Mold

Figure 1:
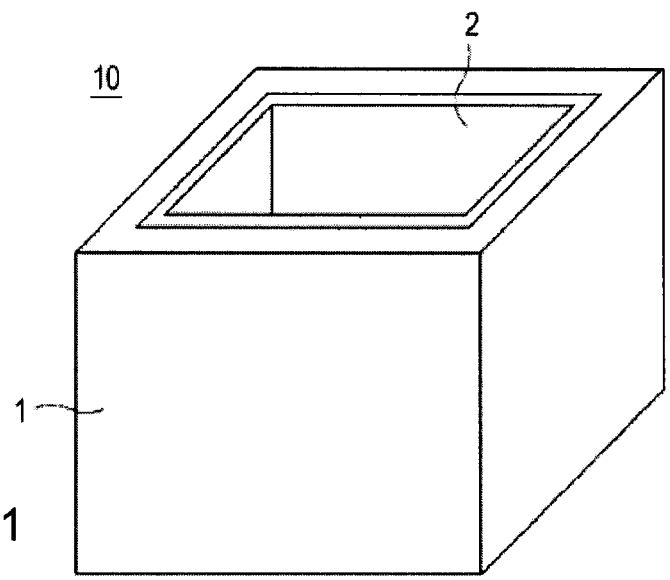
FIG. 1 is an illustration of a perspective view of a mold according to an embodiment of the disclosure.
Figure 2:
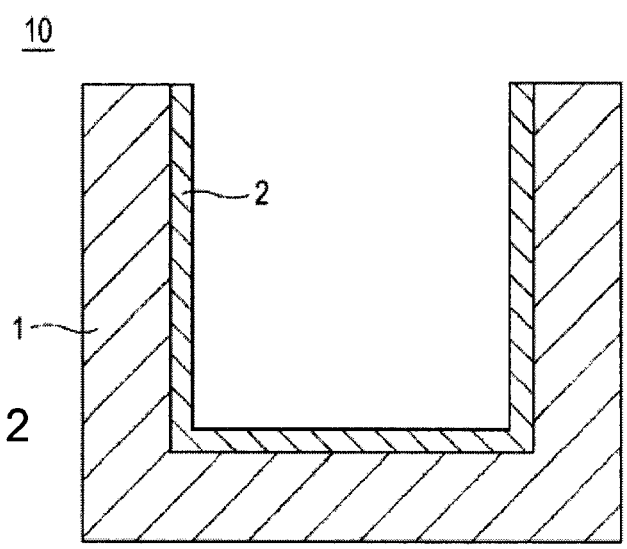
FIG. 2 is an illustration of a section view of the mold according to an embodiment of the disclosure.

FIGS. 1-2 show a perspective view and a section view of mold 10 respectively for producing (molding) a silicon ingot according to an embodiment of the present invention. Mold 10 may comprise a mold base 1 and a releasing layer 2. The top of the mold 10 is open. In this embodiment, the mold 10 is formed such that a concave inner space for storing a silicon melt may be, without limitation, a rectangular parallelepiped that is square in top view.

In one embodiment, a silicon ingot can be produced by feeding a silicon melt into the mold 10. The silicon melt can be obtained by heating and melting silicon at a high temperature, and by subjecting the silicon melt to unidirectional solidification in the mold 10. In another embodiment, a silicon ingot may be produced by melting a silicon material in the mold 10 and subsequently solidifying the resultant silicon melt in the mold 10. The resultant silicon ingot is sliced at a certain thickness (e.g., 200 microns) to provide a large number of silicon substrates. The thus-obtained silicon substrates can be used as substrates for solar cell elements in embodiments described below.

The mold base 1 may be composed of, for example, without limitation, a carbon material such as graphite or a carbon fiber reinforced material, quartz, silica, or a ceramic. The mold base 1 may be one piece and integrally molded with any of the materials described above. Alternatively, the mold base 1 may be formed by assembling separate members as the bottom and the walls of the mold base 1.

The releasing layer 2 may be formed on the inner surface of the mold base 1. The releasing layer 2 is formed for the purpose of ensuring releasability of a silicon ingot from the mold 1. The releasing layer 2 is mainly composed of silicon nitride. The releasing layer 2 can be formed by applying a slurry (releasing agent slurry) comprising silicon nitride powder. The slurry can be applied with a spatula, a brush, by spraying, or other application method. The slurry can be prepared by a technique described below according to an embodiment of the disclosure. The applied slurry is then allowed to air-dry, or can be dried with heat. Additional methods of forming the mold according to one or more embodiments are described in the context of discussion of FIGS. 6A and 6B below.

Hereinafter, a method for forming the mold 10, and more specifically, a method for forming the releasing layer 2 is described according to an embodiment of the disclosure. According to this embodiment, the releasing layer 2 is formed with silicon nitride powder that has been subjected to a surface oxidation treatment as described below.

Surface Oxidation of Silicon Nitride Particles

Silicon nitride powder, which is a material of the releasing layer 2, is subjected to a surface oxidation treatment. Such a silicon nitride powder that has been subjected to a surface oxidation treatment is used for forming the releasing layer 2 because the strength of the resultant releasing layer 2 is enhanced by a mechanism described below at the time of producing a silicon ingot.

For example, the silicon nitride powder is prepared by an imide decomposition method and has an average particle size of about 0.1 to 10.0 µm. The silicon nitride powder may be crystalline or non-crystalline. The silicon nitride particles of the silicon nitride powder may, without limitation, have a regular shape such as a spherical shape or may be amorphous.

The surface oxidation treatment is conducted by charging silicon nitride powder into a vessel. The vessel is composed of quartz or the like, capable of resisting high temperatures, and can suppress entry of impurities. The silicon nitride powder may then be heated with a batch-type electric furnace or a continuous-type tunnel furnace in an oxidizing atmosphere at a temperature of about 700° C. to about 1300° C. for a certain period of time (e.g., 30 min.). As a result of the surface oxidation treatment, amorphous silicon dioxide layers (oxide layers) are formed on the surfaces of silicon nitride particles. Hereinafter, such surface-oxidized particles of the silicon nitride powder may be referred to as surface-oxidized silicon nitride particles.

Figure 3A:
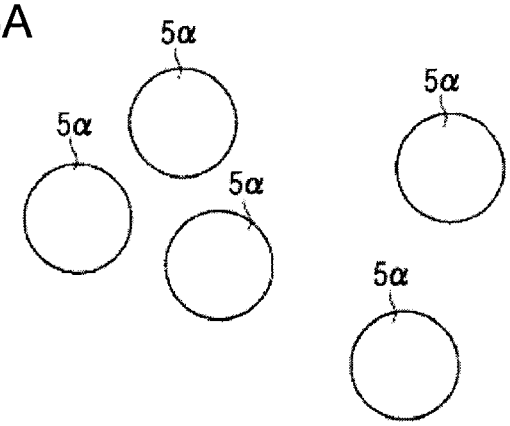
FIGS. 3A-3B are schematic illustrations of the states of silicon nitride powder before and after a surface oxidation treatment respectively.
Figure 3B:
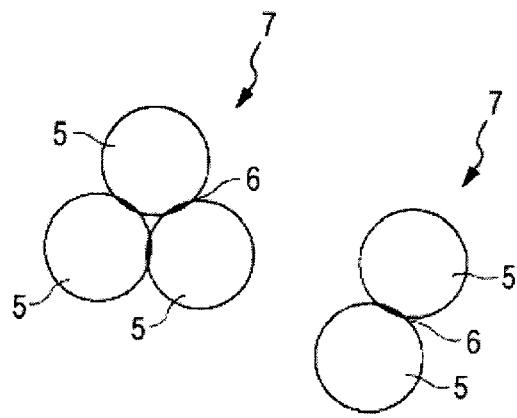

FIGS. 3A-3B are schematic illustrations of the states of a silicon nitride powder before and after a surface oxidation treatment according to an one or more embodiments of the disclosure. FIG. 3A shows the silicon nitride particles before the surface oxidation treatment. FIG. 3B shows the surface-oxidized silicon nitride particles obtained by the surface oxidation treatment.

By conducting the surface oxidation treatment, the surfaces of silicon nitride particles 5α in FIG. 3A are oxidized to provide surface-oxidized silicon nitride particles 5 in FIG. 3B having oxide layers (not shown) on the surfaces of the surface-oxidized silicon nitride particles 5. The silicon nitride powder (FIG. 3B) includes agglomerated particle clusters 7 in which some surface-oxidized silicon nitride particles 5 cohere through oxide layers of the particles 5 as bonding portions 6. The presence of the agglomerated particle clusters 7 hinders formation of the releasing layer 2 having a high flatness (i.e., since large objects project out more from the surface). For this reason, the cohered particles are separated as described below.

Silicon nitride powder can include silicon nitride particle clusters that can have a size of several centimeters and can be formed by adhesion of the silicon nitride particles to one another. Such silicon nitride particle clusters are preferably parted into the silicon nitride powder prior to a surface oxidation treatment. Such a silicon nitride particle clusters may be formed by adhesion of the silicon nitride particles having a size on the order of a micron to one another under the influence of static electricity or the like. Since the adhesion of the silicon nitride particles is kept by an extremely weak force, silicon nitride particle clusters are readily parted into powder, for example, by scrubbing the silicon nitride particle clusters by hand. Thus, the silicon nitride particle clusters can be parted into powder by grinding the silicon nitride powder containing the silicon nitride particle clusters with a mortar or the like or by sifting the silicon nitride powder through a sieve having a size of about 8.6 mesh (sieve opening: 500 µm) to 30 mesh (sieve opening: 2 mm). In particular, in the case of using a sieve, adhesion of particles to one another in the silicon nitride clusters can be forcefully broken by shaking the sieve or grinding the silicon nitride clusters under an application of a force with a roller or the like. In the present embodiment, the silicon nitride powder in which the silicon nitride clusters have been parted into powder is subjected to a surface oxidation treatment as explained above. In this manner, oxide layers formed on the surfaces of the surface-oxidized silicon nitride particles 5 (FIG. 3B) having a uniform thickness can be formed on substantially all of the surface-oxidized silicon nitride particles 5 and variation in oxidation degrees among the surface-oxidized silicon nitride particles 5 can be suppressed.

The preferred thickness of oxide layers formed on the surfaces of silicon nitride particles by a surface oxidation treatment varies depending on the particle size of the silicon nitride powder. For example, when silicon nitride powder has an average particle size of 10.0 µm, the thickness of the oxide layers can be preferably at least 1 nm and at most 100 nm. When silicon nitride powder has an average particle size of about 0.1 µm, the thickness of the oxide layers preferably can be at least about 10 nm or at most about 50 nm. When a heating temperature is between about 900° C. and about 1100° C., a heating time for forming oxide layers having such a thickness is about 4 to 7 hours. When heating is conducted at a temperature higher than 1100° C., the surface oxidation treatment can be conducted by heating for a short period of time of about 1 to 2 hours. However, this temperature condition increases variation in the thickness of the oxide layers. Thus, the heating temperature is preferably between about 900° C. and about 1100° C.

In one embodiment, the silicon nitride powder is chosen so as to reduce content of metal impurities in a silicon ingot and thereby enhancing the efficiency of a solar cell element. For example, the silicon nitride powder may contain metal impurities such as iron (Fe) and aluminum (Al) in an amount of about 100 ppm or less, more preferably 50 ppm or less.

When the releasing layer 2 is formed with the silicon nitride powder that has been subjected to a surface oxidation treatment as described above and the mold 10 is heated to a relatively high temperature (for example, near the melting point of silicon) in the production of a silicon ingot, oxide layers on the surfaces of the surface-oxidized silicon nitride particles constituting the releasing layer 2 are softened and modified by oxidation to generate Si—OH (silanol group). Such silanol groups are bonded to each other to form Si—O—

Si (siloxane bond). This increases adhesion between the surface-oxidized silicon nitride particles, thereby increasing the strength of the releasing layer 2. As explained above, the releasing layer 2 is formed by applying a slurry (releasing agent slurry) containing the surface-oxidized silicon nitride particles. An exemplary embodiment of preparing the slurry is described below.

Preparation of Slurry

A process for preparing a releasing agent slurry with which the releasing layer 2 is formed is conducted by agitating a mixture of silicon nitride powder that has been subjected to a surface oxidation treatment as described above and a solution (binder solution) comprising a binder and a solvent. This preparation of a releasing agent slurry is also referred to as slurrying.

Examples of the binder may include, without limitation, polyvinyl alcohol (PVA), polyvinyl butyral (PVB), methyl cellulose (MC), carboxymethyl cellulose (CMC), ethyl cellulose (EC), hydroxypropyl cellulose (HPC), and wax, which are well known. Examples of the solvent may include, without limitation, water, methanol, and dimethyl sulfoxide. In an embodiment, a slurry is prepared by agitating a mixture of the silicon nitride powder and an about 5 to 15 weight % aqueous solution of polyvinyl alcohol satisfying a weight ratio of about $0.4 \leqq$ (polyvinyl alcohol aqueous solution/surface-oxidized silicon nitride powder)$\leqq 1$. The slurrying may be conducted by using a blade mixer.

Alternatively, the process for preparing a slurry may be conducted by two-step agitation rather than by adding a certain amount of a binder solution in one step to the silicon nitride powder so that the mixture ratio described above is satisfied and agitating the resultant mixture. The certain amount may be, for example, an about 8 weight % aqueous solution of polyvinyl alcohol satisfying a weight ratio of 0.48 (polyvinyl alcohol aqueous solution/surface-oxidized silicon nitride powder). The two-step agitation comprises a first agitation step comprising adding a minimum amount (i.e., a first portion) of a binder solution (e.g., about 73% to 93% of the certain amount provided to the slurry) to the silicon nitride powder to obtain a first resultant mixture. The first agitation step can then agitate the first resultant mixture. The minimum amount is smaller than the certain amount and is chosen so as to, for example, allow pellets (i.e., clusters of surface-oxidized silicon nitride particles) to be broken up efficiently, as explained in more detail below. In the subsequent second agitation step, the remainder (second portion) of the binder solution is added to the first resultant mixture to obtain a second resultant mixture. The second portion is of a sufficient amount so that the certain amount of the binder solution added is substantially equal to the certain amount. The second resultant mixture is then agitated.

In general, addition of a solution to powder and agitation of the resultant mixture may cause particle cluster generation by the solution capturing particles in the initial stage of the agitation. Some particles may form particle clusters that are pellet shaped. In this manner, as the agitation proceeds, the pellets may be broken up into smaller particle clusters.

In the first agitation step, a binder solution is added in a minimum amount that will form a slurry with surface-oxidized silicon nitride powder. The first resultant mixture is agitated in such a way as to form as many pellets as possible in this initial stage of the agitation. The pellets are efficiently broken up in the subsequent second stage of the agitation. Specifically, the first agitation step is conducted such that the resultant releasing agent slurry has a predetermined viscosity range of about 300 to 600 decipascal-seconds (dPa·s).

According to an embodiment of the disclosure, an amount of the first portion of the binder solution should be substantially equal the minimum amount necessary to form a slurry. Because, when the first portion of the binder solution in an amount more than the minimum amount necessary to form a slurry is added to silicon nitride powder, the silicon nitride powder is dispersed uniformly in the entirety of the solution. Moreover, any excess amount of the first portion more than the minimum amount necessary degrades the breaking up efficiency of the pellets, which is not desirable. On other hand, when the amount of the first portion of the binder solution is too small, silicon nitride powder cannot be dispersed in the binder solution and a slurry may not be formed.

In the second agitation step, the remainder (second portion) of the binder solution is added to the resultant slurry (first resultant mixture) to obtain a second resultant mixture. The second resultant mixture is then agitated. As a result, the resultant releasing agent slurry has free flowability, that is, the releasing agent slurry flows under its own weight, and the releasing agent slurry has a reduced apparent viscosity. For example, a releasing agent slurry after the first agitation step has a viscosity of 300 to 600 dPa·s as described above, whereas a releasing agent slurry after the second agitation step has a viscosity of 30 to 80 dPa·s. In the present embodiment, a releasing agent slurry is prepared by two steps of the first agitation step and the second agitation step. This permits preparation of a releasing agent slurry having a smaller viscosity than a releasing agent slurry prepared by mixing silicon nitride powder and a binder solution in one step in an amount equal to that of a binder solution used in the two steps. A releasing agent slurry with such a reduced viscosity enhances efficiency of disintegrating agglomerated particle clusters, which is described below.

FIGS. 4A-4C are schematic illustrations of a change of the state of silicon nitride powder in a slurry according to an embodiment of the disclosure.

FIG. 4A schematically shows the configuration of a pellet 8 formed in the first agitation step. The pellet 8 is a temporarily-formed particle cluster comprised of surface-oxidized silicon nitride particles 5 and agglomerated particle clusters 7 (cohered surface-oxidized silicon nitride particles) of the surface-oxidized silicon nitride particles 5 through the contact surfaces thereof as bonding portions 9. FIG. 4B shows a state of the silicon nitride powder after the first agitation step. In this state, the surface-oxidized silicon nitride particles 5 are not necessarily separated from each other and the agglomerated particle clusters 7 are present and the pellets 8 (8β) with a reduced size also remain.

Decohesion

After a releasing agent slurry (first slurry) is obtained, a treatment (disintegration treatment) may be conducted to separate the cohered surface-oxidized silicon nitride particles in the releasing agent slurry. The disintegration treatment is conducted to break bonds (i.e., for FIGS. 3A-3B and 4A-4C, bonding portions 6) formed between oxide layers on the surfaces of oxidized silicon nitride particles in agglomerated particle clusters. To break the bonds formed between oxide layers, an external force such as a shear force or an impact force is applied, thereby disintegrating the agglomerated particle clusters into individual silicon nitride particles.

The disintegration treatment is not a pulverization treatment in which the particles of silicon nitride powder are crushed to decrease the size of the particles. Such a pulverization treatment is not preferable because this treatment damages surface-oxidized silicon nitride particles and exposes silicon nitride surfaces of the particles that are not covered by oxide layers. Exposing silicon nitride surfaces of the particles that are not covered by oxide layers leads to a decrease in the strength of the releasing layer 2.

FIG. 4C shows an example of a state of the surface-oxidized silicon nitride particles 5 in a releasing agent slurry after the disintegration treatment. Specifically, as a result of conducting the disintegration treatment, most of the surface-oxidized silicon nitride particles 5 are separately present in the releasing agent slurry. Although the pellets 8β can be present before the disintegration treatment as described above, the pellets 8β in which the bonding strength between surface-oxidized silicon nitride particles 5 is weaker than that in the agglomerated particle cluster 7 are certainly broken up by the disintegration treatment. Thus, the presence of the pellets 8β before the disintegration treatment may cause no problem.

The disintegration treatment can be conducted with a ball mill, an oscillating mill, a dispersing apparatus (hereinafter, referred to as a rotor-stator dispersing apparatus) employing the rotor-stator principle disclosed in Japanese Unexamined Patent Application Publication No. 7-100352 content of applicable parts of which is incorporated by reference herein, or the like.

For example, when a ball mill is used, disintegration of agglomerated particle clusters of silicon nitride particles in a releasing agent slurry is achieved by charging a vessel with balls that serve as disintegration media and the releasing agent slurry and rotating the vessel. When the vessel rotates, the balls impact against the agglomerated particle clusters or apply a shear force to the agglomerated particle clusters between the balls being rotated. In order to reduce entry of impurities into a releasing agent slurry, the inner surface of the vessel and the balls are preferably coated with a resin or the like that does not adversely affect the properties of solar cell elements.

According to an embodiment, in order to enhance the efficiency of the disintegration and to reduce damage to the oxide layers, an oscillating mill may be used instead of a ball mill. An oscillating mill can provide a larger disintegration force in a short period of time by oscillating a vessel than a ball mill. Thus, damage to the surfaces of silicon nitride powder is effectively reduced by using an oscillating mill. Use of a planetary mill also provides a similar effect.

Use of a rotor-stator dispersing apparatus permits application of a high shear force between a rotor and a stator and disintegration of only agglomerated particle clusters by adjusting the spacing between the rotor and the stator. A rotor-stator dispersing apparatus having a configuration in which a slurry can be passed between a rotor and a stator permits disintegration of agglomerated particle clusters by advantageously applying a shear force to the agglomerated particle clusters. This configuration is preferable because damage to the surfaces of silicon nitride powder can be reduced. From the viewpoint of reducing entry of impurities into a releasing agent slurry, the rotor-stator parts of the apparatus are preferably coated with tungsten carbide (WC) or the like.

As described above, since a releasing agent slurry with a low viscosity obtained by the two-step agitation process is subjected to a disintegration treatment, the releasing agent slurry fed to a disintegration apparatus such as a ball mill or a rotor-stator dispersing apparatus flows smoothly between balls or between a rotor and a stator that serves as disintegration media. Thus, disintegration that is efficient and uniform in the entirety of a releasing agent slurry can be achieved.

The disintegration treatment is preferably conducted to an extent where a size of the surface-oxidized silicon nitride particle at 90% of cumulative particle size distribution of the silicon nitride powder in a releasing agent slurry is about 10 μm or less. With this particle size distribution, agglomerated particle clusters as well as independent surface-oxidized silicon nitride particles can be treated as particles. When the cohered particles are separated to this extent, flaking of the releasing layer 2 formed by applying a releasing agent slurry is advantageously suppressed.

In the present embodiment, the cohered surface-oxidized silicon nitride particles are separated when the particles are in slurry. As a result, adhesion of fine silicon nitride powder (i.e., fine powder resulting from disintegration of surface-oxidized silicon nitride particles) to the inner wall and other surfaces of a disintegration vessel by static electricity is suppressed. The suppression of fine silicon nitride powder adhesion also reduces adhesion of the melted silicon during molding, and thus makes possible removal of the finished silicon ingot with less contamination from releasing powder flakes. Also, time required for cooling the particles is reduced because a temperature increase caused by disintegration is reduced by the slurry.

Addition of Silicon Dioxide Powder to Slurry

The releasing layer 2 can be formed with a releasing agent slurry that has been subjected to the disintegration treatment described above. To enhance the strength of the releasing layer 2, for example, silicon dioxide particles ($SiO_2$), silicon carbide (SiC) particles, or the like can be added to a releasing agent slurry (second slurry) that has been subjected to the disintegration treatment.

For example, silicon dioxide powder has an average particle size of about 20 μm obtained by pulverizing silica glass and classifying the resultant particles.

A releasing agent slurry mixed with silicon dioxide powder is agitated with an agitator. The mixture of a releasing agent slurry and silicon dioxide powder may be prepared with a ball mill.

When a silicon ingot is produced with the mold 10 having the releasing layer 2 formed with such a releasing agent slurry mixed with silicon dioxide powder, a relatively high temperature of about several hundreds of degrees centigrade causes generation of silanol groups (Si—OH) on the surface of silicon nitride particles, Si—OH on the surface of silicon dioxide powder, and siloxane bonds (Si—O—Si) can be formed between the silanol groups. This enhances adhesion among surface-oxidized silicon nitride particles more than the case of not being mixed with silicon dioxide powder, thereby further increasing the strength of the releasing layer 2. That is, addition of silicon dioxide powder to a releasing agent slurry enhances adhesion among the surface-oxidized silicon nitride particles, thereby further increasing the strength of the releasing layer 2. This further suppresses flaking of the releasing layer 2 and the possibility of flakes entering a silicon melt during production of a silicon ingot.

In one embodiment, silicon dioxide powder or the like can be added to a releasing agent slurry prior to the disintegration treatment.

When the mold base 1 is composed of a carbon material, an oxidation reaction between silicon dioxide powder in the releasing layer 2 and carbon constituting the mold base 1 can occur at or near the melting point of silicon, which can accelerate damage to the mold base 1. To suppress this phenomenon, when the mold base 1 is composed of a carbon material, the proportion of the amount of silicon dioxide powder to be added to a releasing agent slurry is preferably smaller by weight than the proportion of silicon nitride powder in the releasing agent slurry. For example, the proportion of silicon dioxide powder to be added to a releasing agent slurry may be, without limitation, 25% smaller by weight than the proportion of silicon nitride powder to be added to the releasing agent slurry.

Formation of Releasing Layer

A releasing agent slurry obtained as described above may be applied to the inner surface of the mold base 1 to form the releasing layer 2. In this manner, the mold 10 is produced.

As explained above, the releasing layer 2 may be formed by applying the releasing agent slurry with a spatula, a brush, or the like or by spraying and by allowing the applied slurry to air-dry or drying the applied slurry on a hot plate. The thickness of the releasing layer 2 may preferably be, without limitation, about 0.3 to 2 mm.

As described above, the releasing layer 2 is formed with a releasing agent slurry in which cohesion of the surface-oxidized silicon nitride particles has been reduced by subjecting the slurry to the disintegration treatment. This treatment eliminates bulky agglomerated particle clusters that have been present in silicon nitride powder after a surface oxidation treatment. The resultant releasing layer 2 comprises a flat surface and includes the surface-oxidized silicon nitride particles uniformly dispersed in its slurry.

Since the releasing layer 2 is formed with silicon nitride powder that has been subjected to a surface oxidation treatment in production of a silicon ingot with the mold 10, oxide layers on the surfaces of the silicon nitride particles are softened and modified by oxidation to generate a Si—O—Si siloxane bond. This ensures sufficient strength of the releasing layer 2.

In summary, a mold obtained by the steps described above has a releasing layer with a high surface flatness and advantageously suppresses flaking of the releasing layer. By suppressing flaking of the releasing layer, flakes from the releasing layer are substantially eliminated or suppressed from entering the silicon melt during production of a silicon ingot, while the silicon melt substantially avoids coming into contact with the mold.

Manufacturing of a Silicon Ingot and a Substrate for a Solar Cell Element

Hereinafter, a method for manufacturing a silicon ingot with the thus-formed mold 10 to provide a substrate for a solar cell element is described in detail.

In one embodiment, the mold 10 is placed in an argon (Ar) atmosphere at a reduced pressure of 9 to 12 kPa. The mold 10 is heated to a temperature equal to or slightly lower than the temperature of a silicon melt, that is, a temperature lower than the melting point of silicon by several tens of degrees Celsius. The melting point of silicon is generally about 1414° C. When the mold 10 reaches such a temperature, a silicon melt prepared in advance is poured into the mold 10. Alternatively, the mold 10 may be charged with a silicon material and the silicon material may be heated and melted in the mold 10. The silicon melt can be of p-type doped achieved by doping silicon with a dopant such as boron.

The temperature of the mold 10 is then gradually decreased from its bottom to subject the silicon melt to unidirectional solidification from the bottom of the mold 10. When the silicon melt is solidified completely, a silicon ingot is obtained.

In the present embodiment, the mold 10 having the releasing layer 2 formed in the manner described above is used. Use of this mold 10 advantageously substantially prevents or reduces flaking of the releasing layer 2 during production of a silicon ingot, and substantially prevents or reduces flakes from entering the silicon melt as an impurity. Use of mold 10 also prevents or reduces the silicon melt from coming into contact with and fusing with the mold 10.

Substrates for solar cell elements are obtained by releasing the thus-produced silicon ingot from the mold 10, cutting the silicon ingot to have a certain size, and slicing the silicon ingot with a multiwire saw or the like.

In summary, according to the present embodiment, substrates with which solar cell elements can be manufactured can be obtained in high yields. These solar cell elements do not have degraded leakage properties, which are resulted from, during production of a silicon ingot, contact between a silicon melt and the mold or entry of flaked matter into the silicon melt.

Solar Cell Element and Method for Manufacturing the Solar Cell Element

Figure 5:
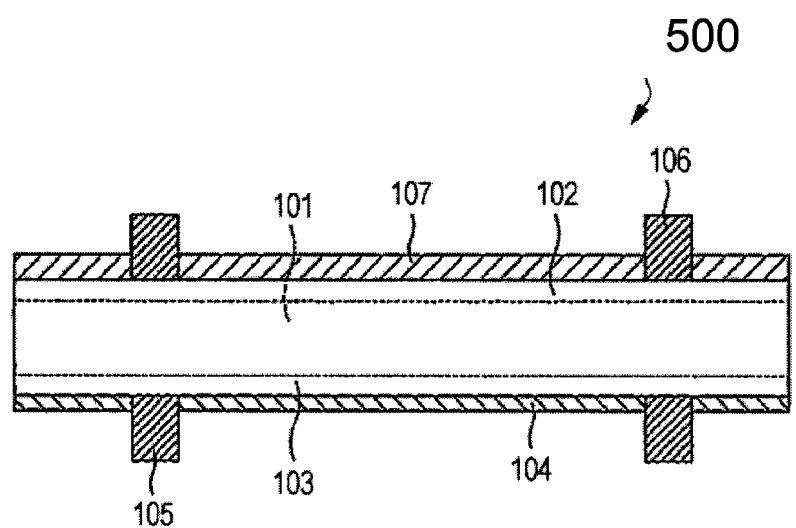
FIG. 5 is an illustration of a schematic section view of a solar cell element according to an embodiment of the disclosure.

FIG. 5 is an illustration of a schematic section view of a solar cell element 500 according to an embodiment of the disclosure. The solar cell element 500 may comprise a substrate 101, a diffusion layer 102, a collecting electrode 104, an output electrode 105, a front surface electrode 106, and an anti-reflection coating 107.

The substrate 101 is a monocrystalline or polycrystalline silicon substrate obtained by slicing a silicon ingot produced with the mold 10 described above.

The diffusion layer 102 is a layer having n-type conductivity formed by diffusing an n-type impurity into the entire surface of the substrate 101 (the upper main surface of the substrate 101 in FIG. 5) to a certain depth.

The collecting electrode 104 and the output electrode 105 constitute a back surface electrode and are mainly composed of, for example, silver. Alternatively, the collecting electrode 104 may be mainly composed of aluminum.

The front surface electrode 106 is formed on the front surface side of the substrate 101 and mainly composed of, for example, silver. The anti-reflection coating 107 is composed of, for example, silicon oxide, silicon nitride, titanium oxide, or the like and formed on the upper surface of the diffusion layer 102.

An example of a method for manufacturing the solar cell element 500 is described below.

A silicon ingot produced in the embodiment described above may be sliced. The resultant substrate 101 having the p-type conductivity may be processed so that a surface (light-receptive surface) of the substrate 101 has irregularities. Then, the diffusion layer 102 may be formed by diffusing an n-type impurity into the surface of the substrate 101 to a constant depth near the surface. Thus, a p-n junction may be formed between the diffusion layer 102 and the substrate 101. Additionally, an anti-reflection coating composed of silicon oxide, silicon nitride, titanium oxide, or the like may be formed on the surface of the substrate 101.

The collecting electrode 104 can be formed by applying an electrode paste mainly composed of silver to the back surface of the substrate 101 and firing the electrode paste. The front surface electrode 106 and the output electrode 105 are then respectively formed by applying an electrode paste mainly composed of silver in certain patterns to the front surface side and the back surface side of the substrate 101 and firing the electrode paste. In this manner, the solar cell element 100 is formed.

Additionally, a back surface field (BSF) layer 103, which is a high concentration p-type diffusion layer, may be formed on the back surface side of the substrate 101. The BSF layer 103 is formed, in the case of forming the collecting electrode 104 with aluminum, through diffusion of aluminum into the substrate 101 in the formation of the collecting electrode 104 (applying and firing of an aluminum paste).

Alternatively, the solar cell element 500 may have a configuration in which an electrode is formed only on the back surface side of the solar cell element 500.

The solar cell element 500 according to the present embodiment is manufactured with the substrate 101, which is obtained by slicing a silicon ingot produced with the mold 10 produced by the method described above. Thus, the solar cell elements can be manufactured in high yields that do not have degraded leakage properties, which are resulted from, during production of a silicon ingot, contact between a silicon melt and the mold or entry of flaked matter into the silicon melt.

Reduction in Thickness of Substrate

When the solar cell element 500 having good properties and high reliability is manufactured with the substrate 101 having a relatively small thickness such as about 200 μm or less, the substrate 101 is preferably manufactured to have an enhanced strength. This is achieved by producing a silicon ingot from which the substrate 101 is to be sliced so that the concentration of metal impurities is reduced and the concentration of interstitial oxygen (Oi) measured by infrared absorption spectroscopy satisfies Oi≧2E17 (atoms/cm$^3$).

To produce such a silicon ingot, it is preferred that silicon nitride powder is subjected to a surface oxidation treatment such that the surface-oxidized silicon nitride particles and thus the silicon nitride powder to be used for forming the releasing layer 2 has an oxygen concentration of at least about 6.0% by weight. In general, in a solidification process in production of a silicon ingot, the oxygen concentration of a silicon melt decreases exponentially by extremely quick vaporization of SiO gas as the solidification of the silicon melt proceeds. In this case, when silicon nitride powder has an oxygen concentration of about 6.0 wt % or more, oxygen is properly supplied to a silicon melt from the releasing layer 2 and a silicon ingot having a concentration of Oi satisfying the condition described above can be obtained. When the surface oxidation treatment is practiced, treatment time (period for a heating treatment) may be appropriately determined in accordance with the condition of the oxygen concentration described above and the thickness of oxide layers.

When silicon nitride powder has a higher oxygen concentration, the releasing layer 2 formed with the silicon nitride powder tends to exhibit a poorer releasability. For this reason, it is preferred that silicon nitride powder having a calcium concentration (Ca) satisfying 5 ppm<Ca<50 ppm is subjected to a surface oxidation treatment. Since Ca degrades the structure of silicon nitride, it is basically preferred that silicon nitride powder does not contain Ca. However, when silicon nitride powder contains Ca in the range described above, Ca enhances releasability of a silicon ingot from a mold.

When silicon nitride powder having an oxygen concentration of about 6.0 wt % or more is used, the silicon nitride powder preferably has a carbon concentration of about 1500 ppm or less. When the carbon concentration is in this range, degradation of properties of a solar cell element can be suppressed, the degradation being caused by generation of oxygen precipitation in a silicon ingot caused by the presence of carbon.

Silicon nitride powder preferably has a chlorine concentration (Cl) satisfying 30 ppm<Cl<80 ppm. When silicon nitride powder has a chlorine content of more than about 30 ppm, oxide layers are easily formed on the surfaces of the particles of the silicon nitride powder, thereby decreasing time required for an oxidation treatment. Cl is also preferably less than about 80 ppm in view of easiness of adjusting the viscosity of a releasing agent slurry and coating properties of a releasing agent slurry.

Repetitive Use of Mold Base

The mold base 1 composed of a carbon fiber reinforced material may be repetitively used for formation of the mold 10 and subsequent production of a silicon ingot. In a repetitive process, a silicon ingot is produced, released from the mold 10, and the releasing layer 2 remaining on the inner surface of the mold base 1 is removed. The releasing layer 2 may be removed with a brush, a spatula, or the like, or by blasting. The repetitive process may be repeated many times.

When the releasing layer 2 is removed, a silica layer can enter and remain in or among carbon fibers constituting the mold base 1. When the releasing layer 2 is newly formed with silicon nitride powder having a high oxygen concentration of about 6.0 wt % on the inner surface of the mold base 1 containing a remained silica layer. The remained silica layer and oxide layers on the surfaces of the particles of the silicon nitride powder can be bonded. This bonding may not cause a problem until a silicon ingot is subsequently produced and released from the mold 10. After that, when the releasing layer 2 remaining on the mold base 1 is removed for repetitive use of the mold base 1, the bonding makes removal of the releasing layer 2 more difficult than in the case of forming the releasing layer 2 with silicon nitride powder having a lower oxygen concentration. An attempt to forcefully remove the releasing layer 2 from the mold base 1 can damage the mold base 1.

To overcome such a problem, for using the mold base 1 repetitively, the releasing layer 2 remaining on the mold base 1 after production of a silicon ingot is removed and the mold base 1 is subjected to an acid treatment using hydrofluoric acid or the like. This treatment removes a silica layer remaining in or among carbon fibers. As a result, when the releasing layer 2 is subsequently formed with silicon nitride powder having a high oxygen concentration and a silicon ingot is produced again, the releasing layer 2 remaining on the mold base 1 can be readily removed after the silicon ingot is released.

Modified Embodiment

Figure 6A:
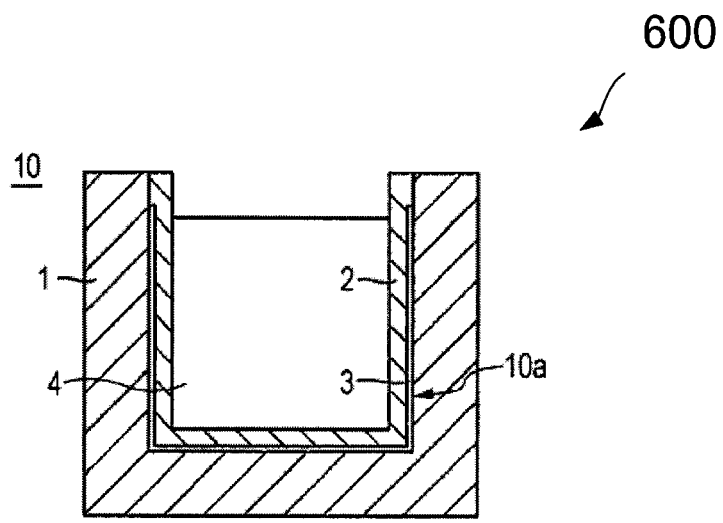
FIGS. 6A-6C are illustrations of schematic section views of a mold according to one or more embodiments of the disclosure.
Figure 6B:
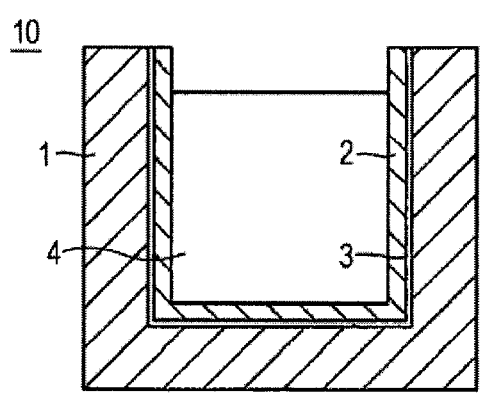
Figure 6C:
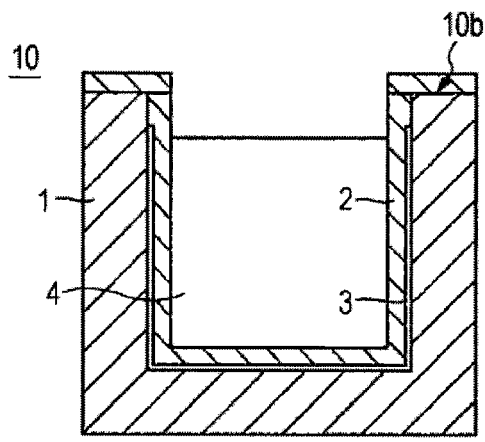

FIGS. 6A-6C are illustrations of schematic views of mold 10 according to one or more embodiments of the disclosure. The mold 10 may comprise the mold base 1, the releasing layer 2, a separating layer 3, and contain a silicon melt 4. FIGS. 6A-6C may share the same parameters, definition and functionality as FIGS. 1-2. Therefore, these definitions and the functionalities are not redundantly explained herein.

FIG. 6A is a schematic section view illustration of a mold configuration according to an embodiment of the disclosure. The mold base 1 may be composed of a carbon fiber reinforced material. The separating layer 3 is located between the mold base 1 and the releasing layer 2. Notably, the separating layer 3 is not formed in an upper portion of a mold side wall 10a where a silicon melt does not reach (a portion located at a higher level than the surface of a silicon melt). Although the separating layer 3 is not formed in the portion higher than the surface of the silicon melt 4 in the mold base 1, little or substantially no bonding may be observed between a silica layer remaining in or among carbon fibers and the oxide layers of silicon nitride powder in this portion. The lack of bonding is generally because pressure and temperature applied to the releasing layer 2 are different between a portion of the releasing layer 2 that is in contact with the silicon melt 4 and a portion of the releasing layer 2 that is not in contact with the silicon melt 4.

The separating layer 3 is preferably formed such that the upper end of the separating layer 3 is positioned at a level between the surface of a silicon melt 4 before solidification and the upper surface of a silicon ingot after the solidification. Solid silicon has a density of about 2.33 g/cm$^3$ while liquid silicon has a density of 2.54 g/cm$^3$. This causes an increase in the volume of silicon by slightly lower than about 10% in solidification of a silicon melt. Specifically, the surface of a silicon melt rises with an increase in the volume of the silicon melt, the increase being caused as unidirectional solidification of the silicon melt proceeds. Thus, the top of a silicon ingot after solidification is positioned at a level higher than the surface of a silicon melt before the solidification.

The separating layer 3 can be formed by applying a solution containing a solvent and a binder containing graphite powder, SiC powder, PVA, or the like. Note that use of graphite powder or SiC powder requires powder of high purity in view of reducing the concentration of impurities in a silicon ingot to be produced in the mold 10, which increases the production cost of the mold 10. Thus, the separating layer 3 is preferably formed with a PVA solution that is used for a releasing agent slurry.

Formation of the separating layer 3 inhibits a silica layer remaining in the mold base 1 even when the mold base 1 is used repetitively. Specifically, since entry of a silica layer into the mold base 1 is suppressed in a portion of the mold base 1 that is covered with the separating layer 3, almost no bonding occurs between a silica layer and the oxide layers of the silicon nitride powder. As a result, the releasing layer 2 remaining on the mold base 1 after production of an ingot can be readily removed.

FIG. 6B is a schematic section view illustration of a mold configuration. The configuration shown in FIG. 6B in which the separating layer 3 is formed over the entire inner wall of the mold base 1 is not preferable. In this configuration, in a portion of the releasing layer 2 that is in contact with the silicon melt 4, the silicon melt 4 presses the releasing layer 2 to the mold and no gap may be produced between the mold base 1 and the releasing layer 2. In contrast, in the level higher than the surface of the silicon melt 4, a gap can be produced between the mold base 1 and the releasing layer 2 because formation of the separating layer 3 reduces adhesion of the releasing layer 2 to the mold base 1. The silicon melt 4 passing up through the releasing layer 2 can flow into the gap.

FIG. 6C is a schematic section view illustration of a mold according to an embodiment of the disclosure. In the embodiment shown in FIG. 6C, the releasing layer 2 is extended to cover an upper wall 10b of the mold 10. In this manner, the influence of the passing up of the silicon melt 4 can be suppressed. The releasing layer 2 formed on the mold upper wall 10b preferably may be thicker than the releasing layer 2 formed on the mold side wall 10a.

In the releasing layer 2 formed with silicon nitride powder having a high oxygen concentration, high adhesion is achieved in the silicon nitride powder constituting the releasing layer 2, and hence, the releasing layer 2 exhibits higher thermal conductivity than releasing layers formed with silicon nitride powder having lower oxygen concentrations. This is preferable in an embodiment where rapid solidification of the silicon melt 4 is intended. In contrast, for example, in the case where suppression of cooling from the mold sidewall 10a (FIG. 6A) is intended, a heat insulator arranged around the mold sidewall 10a is required to be thicker than that in the cases where releasing layers formed with silicon nitride powder having lower oxygen concentrations are used.

In an embodiment where the releasing layer 2 with a reduced thermal conductivity is intended, the releasing layer 2 is preferably formed by mixing a releasing agent slurry with beads of a resin such as an ethyl cellulose resin or an acrylic resin. When the releasing layer 2 is formed with a releasing agent slurry containing resin beads, the resin beads disappear at a high temperature caused by heating of the mold 10 to form fine holes in the releasing layer 2. As a result, the thermal conductivity of the releasing layer 2 is reduced. The heating of the mold 10 occurs, for example, in melting of a silicon material charged into the mold 10 or in preheating conducted in pouring of the silicon melt 4 into the mold 10. The resin beads may have a size of about 0.5 to 20 µm. The amount of the resin beads to be added should be about 1% to 10% by weight on the basis of the entire solid particles (silicon nitride, silicon dioxide, and the resin beads). Alternatively, the mold 10 may have a bilayer structure comprising the releasing layer 2 containing resin beads and the releasing layer 2 without resin beads.

EXAMPLES

Example 1

Three slurries were prepared under different disintegration treatment conditions and releasing layers were formed with the respective slurries to provide three molds.

A high purity silicon nitride powder was prepared that was obtained by an imide decomposition method and had an average particle size of about 0.5 µm. The powder was subjected to a surface oxidation treatment by heating the powder at about 1000° C. for about 5 hours with an electric furnace. In an example, SN-E10 manufactured by Ube Industries, Ltd is used as the high purity silicon nitride powder, The resultant silicon nitride powder and an about 8% aqueous solution of polyvinyl alcohol were mixed with a blade mixer to prepare a slurry. The mixing ratio of the aqueous solution of polyvinyl alcohol to the silicon nitride powder by weight was about 0.48.

Specifically, the slurry was prepared by the first agitation step in which the aqueous solution of polyvinyl alcohol in 9/10 of the total amount of the solution was mixed with the silicon nitride powder and the resultant mixture was agitated for a short period of time so that the silicon nitride powder were turned into pellets; and the second agitation step in which the remainder of the aqueous solution of polyvinyl alcohol (in 1/10 of the total amount of the solution) was additionally mixed with the resultant mixture and agitated. As a result, a slurry with a low viscosity of about 45 dPa·s was obtained.

Three releasing agent slurries were then obtained from the low-viscosity slurry by disintegration treatments under different disintegration conditions. All the disintegration treatments were conducted with an oscillating mill. Specifically, a pot whose inner surface was coated with nylon was charged with disintegration media that were iron balls the surfaces of which were coated with nylon and the slurry such that the slurry accounted for about 80% of the pot.

The first releasing agent slurry A was obtained by conducting a disintegration treatment at a force of about 10 G (i.e., a G-force is about 9.8 m/s$^2$) for about 2 hours. The disintegration conditions for obtaining the releasing agent slurry A will be referred to as "strong disintegration conditions".

The second releasing agent slurry B was obtained by conducting a disintegration treatment at a force of 6 G for 2 hours. The disintegration conditions for obtaining the releasing agent slurry B will be referred to as "weak disintegration conditions".

The third releasing agent slurry C was obtained without conducting any disintegration treatment.

The thus-obtained three releasing agent slurries were measured in terms of particle size distribution by a microtrac method. To measure distribution of particles including agglomerated particle clusters, the slurries were not subjected to an ultrasonic dispersion treatment with an ultrasonic homogenizer prior to the measurement. In an example, Microtrac MT3300EX manufactured by NIKKISO CO., LTD is used to measure the thus-obtained three releasing agent slurries in terms of particle size distribution by a microtrac method.

Figure 7A:
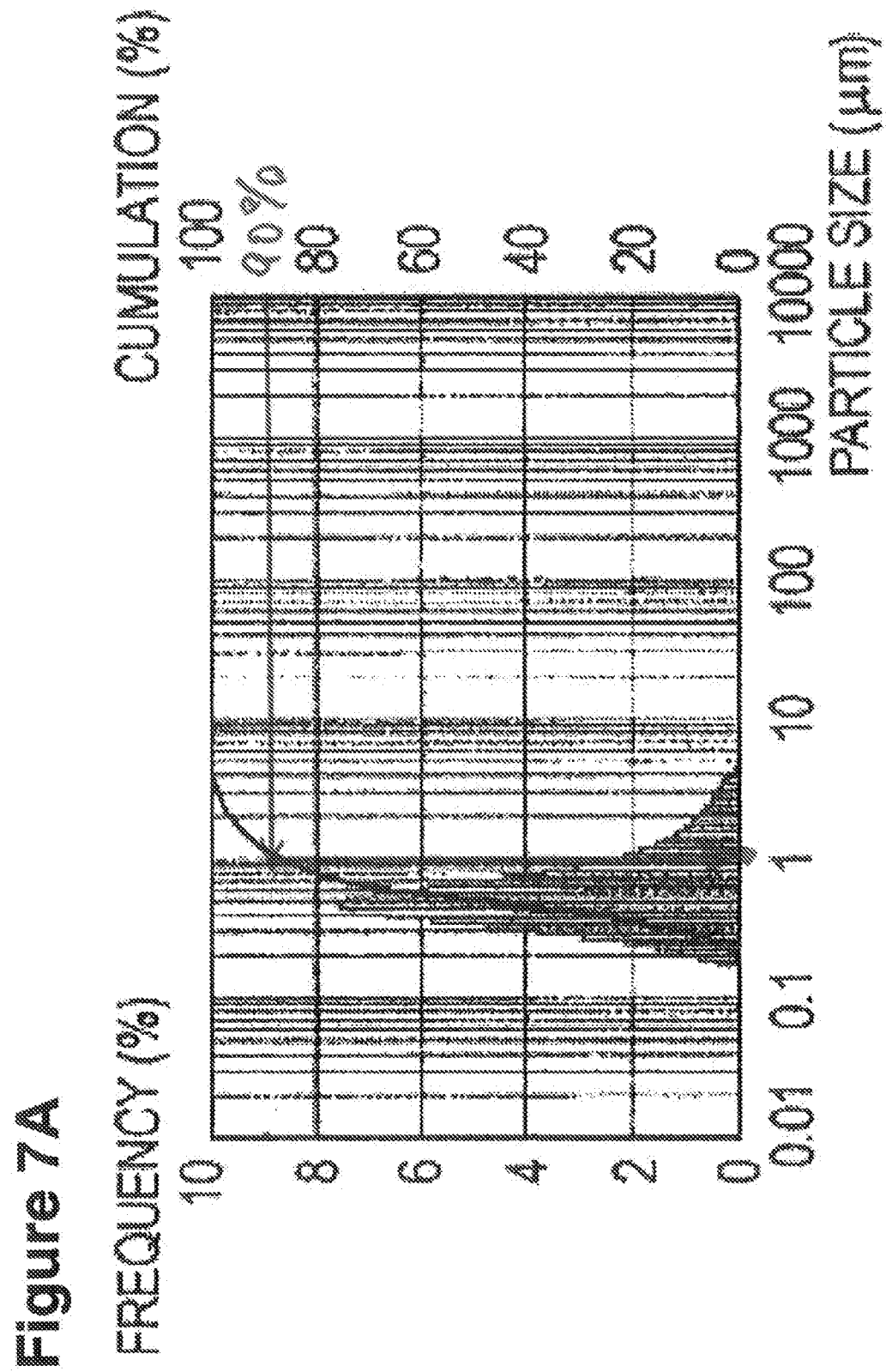
FIG. 7A is an illustration of a graph showing an exemplary particle size measurement result of a releasing agent slurry A according to an embodiment of the disclosure.
Figure 7B:
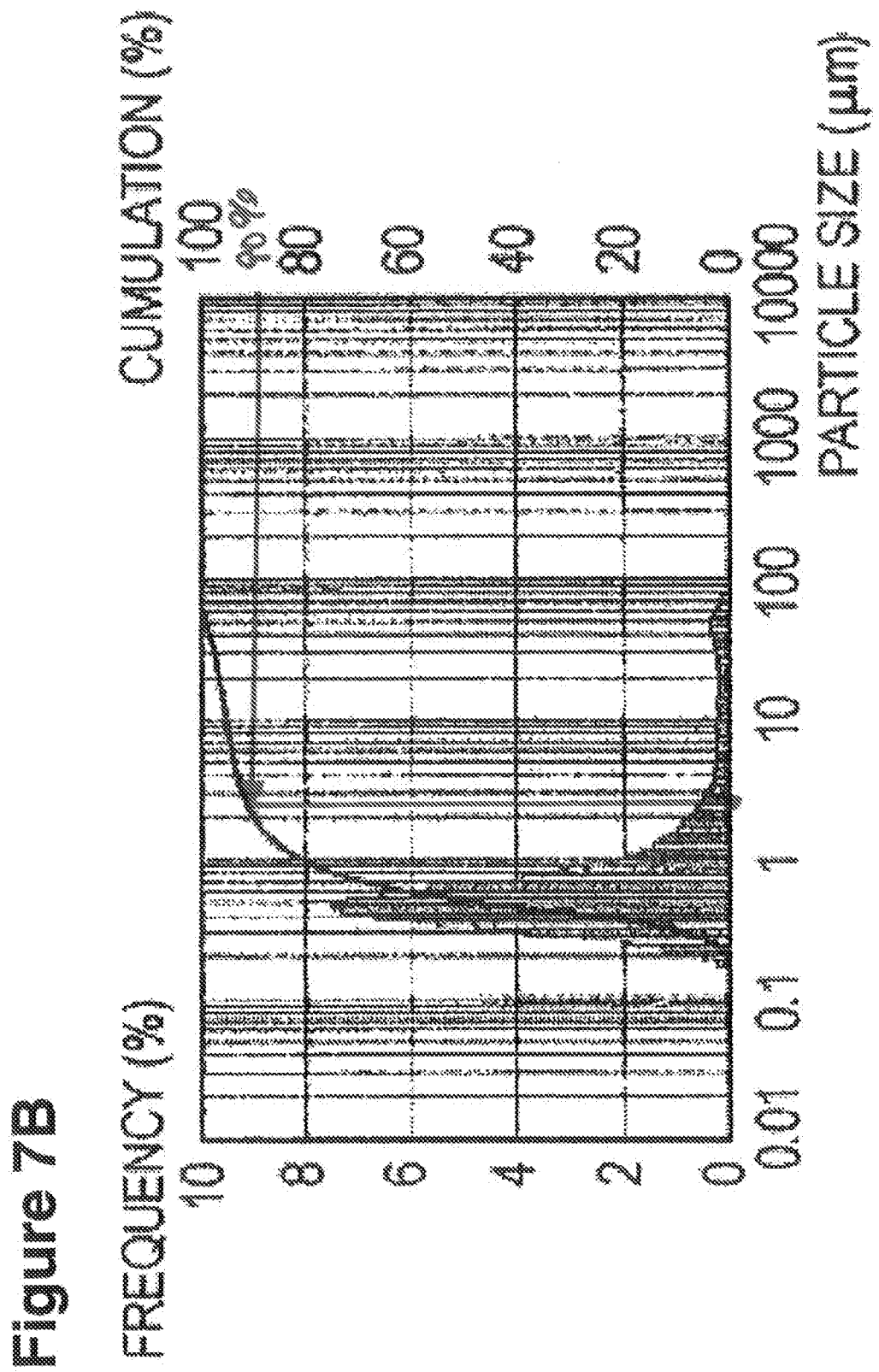
FIG. 7B is an illustration of a graph showing an exemplary particle size measurement result of a releasing agent slurry B according to an embodiment of the disclosure.
Figure 7C:
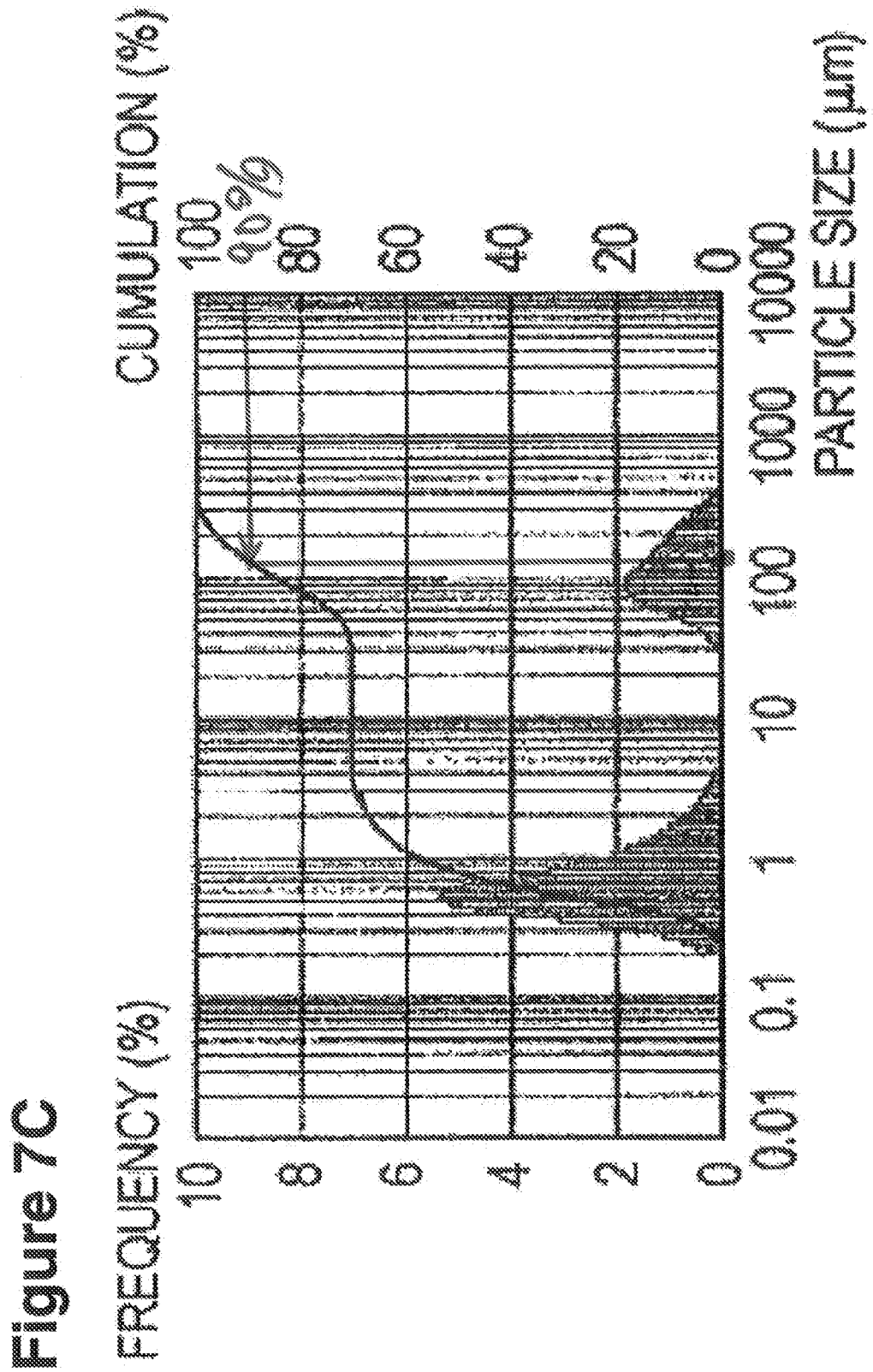
FIG. 7C is an illustration of a graph showing an exemplary particle size measurement result of a releasing agent slurry C according to an embodiment of the disclosure.

FIGS. 7A-7C illustrates graphs showing exemplary measurement results of a releasing agent slurry A, B, and C respectively according to one or more embodiments of the disclosure.

FIGS. 7A-7C indicate that the presence of particles having a size of about 100 μm or more was not observed in the releasing agent slurries A and B obtained as a result of the disintegration treatments with the oscillating mill while the releasing agent slurry C obtained without any disintegration treatment contained a large number of particles having a size of 100 μm or more, that is, cohered particles. Comparison of the particle size distribution results of the releasing agent slurries A and B obtained under different disintegration conditions indicates that the releasing agent slurry A obtained under the strong disintegration conditions did not contain particles having a size of about 10 μm or more while the releasing agent slurry B obtained under the weak disintegration conditions contained a slight amount of particles having a size of about 10 μm or more and about 100 μm or less. In contrast, particle size distributions of the releasing agent slurries A and B in the particle size range of between about 0.1 μm and about 1 μm is almost the same. Analysis of the particle size distribution results of the releasing agent slurries A, B, and C provides a conclusion that a disintegration treatment promotes disintegration of bulky particles having a large size, that is, agglomerated particle clusters of silicon nitride particles.

The three releasing agent slurries A, B, and C were applied to the inner surfaces of graphite mold bases with a brush to form releasing layers having a thickness of 1 mm. These mold bases were placed on a hot plate and dried to provide three molds.

These molds were placed in an argon atmosphere at a reduced pressure of 10 kPa and heated to about 1000° C. with a heater. In this state, about 70 kg of a boron-doped silicon melt was poured into the molds and gradually solidified from the bottoms of the molds. Thus, silicon ingots were produced.

The thus-produced silicon ingots were released from the molds and inspected whether the silicon ingots were fused with the mold bases and the silicon ingots were cracked. The released silicon ingots were then cut and sliced. The thus-obtained wafers (silicon substrates) were visually inspected for the presence of foreign matter and the proportion of the wafers rejected because the presence of foreign matter was determined. The number of the wafers inspected was about 1000.

Phosphorus (P) atoms were implanted in the front surface of each of the thus-obtained silicon substrates by ion implantation to diffuse the phosphorus atoms. Thus, a diffusion layer was formed in the front surface of the silicon substrate. A silicon nitride layer serving as an anti-reflection coating was then formed on the front surface side of the silicon substrate. A silver paste was applied to the front surface side and the back surface side of the silicon substrate and fired to form front surface electrodes and back surface electrodes (collecting electrodes and output electrodes). Thus, solar cell elements according to the present invention were manufactured.

The proportion of the thus-obtained solar cell elements rejected because of leakage was determined. The number of the solar cell elements evaluated was about 1000.

Preparation conditions of the releasing agent slurries and evaluation results of the slurries are summarized in Table 1 below.

TABLE 1

| | Conditions | | | | |
|---|---|---|---|---|---|
| | Disintegration treatment | Disintegration condition | Fusion between mold and ingot and craking of ingot | Proportion of rejected wafers because of foreign matters | Proportion of rejected solar cell elements because of leakage |
| Releasing agent slurry A | Conducted | Strong | None | 0.4% | 0.37% |
| Releasing agent slurry B | Conducted | Weak | None | 1.0% | 0.41% |
| Releasing agent slurry C | None | — | None | 3.5% | 0.98% |

As shown in Table 1, adhesion and fusion between the molds and the silicon ingots did not occur whether a disintegration treatment for eliminating a cohesion of the cohered silicon nitride particles was conducted or not. Table 1 also indicates that the proportion of rejected wafers and the proportion of rejected solar cell elements because of leakage were smaller in the releasing agent slurries A and B obtained as a result of the disintegration treatments than in the releasing agent slurry C obtained without any disintegration treatment.

Comparison between the releasing agent slurries A and B obtained under different disintegration conditions indicates that the proportion of rejected wafers and the proportion of rejected solar cell elements because of leakage were smaller in the releasing agent slurry A, which was obtained by the disintegration treatment under the strong disintegration conditions.

FIG. 7B is an illustration of the result of a releasing agent slurry B of a working example according to an embodiment of the disclosure. FIG. 7B shows that the silicon nitride powder in the slurry B had a particle size of about 10 μm or less at about 90% of cumulative particle size distribution. This result indicates that when a disintegration treatment is conducted to an extent where such particle size distribution is obtained, almost no entry of flaked matter into a silicon ingot occurs. As a result, wafers having good properties and solar cell elements having good properties can be obtained.

The results indicate that, when a mold is formed with a slurry that has been subjected to a disintegration treatment and a silicon ingot is produced with the mold, the mold has a strong releasing layer and the occurrence of flaking of the releasing layer and entry of a flaked portion of the releasing layer during production of the silicon ingot is reduced. As a result, there are reliably obtained wafers that are not rejected because of foreign matters and solar cell elements that are not rejected because of leakage.

Example 2

For the second example, three releasing agent slurries E, F, and G were prepared by respectively adding silicon dioxide powder in different weight ratios to the releasing agent slurry A prepared in the same manner as in example 1. For the releasing agent slurry E, the ratio of silicon nitride powder to silicon dioxide powder was 8 to 2. For the releasing agent slurry F, the ratio of silicon nitride powder to silicon dioxide powder was 6 to 4. For the releasing agent slurry G, the ratio of silicon nitride powder to silicon dioxide powder was 5 to 5.

Silicon ingots were produced with these three releasing agent slurries E, F, and G as in example 1. These silicon ingots were sliced into wafers. These wafers were processed into solar cell elements. In the production of the silicon ingots, the wafers, and the solar cell elements, the occurrence of adhesion between the mold bases and the releasing layers was detected, and the proportion of the wafers rejected because of foreign matters and the proportion of the solar cell elements rejected because of leakage were also determined as in example 1.

Preparation conditions of the releasing agent slurries and evaluation results of the slurries of example 2 are summarized in Table 2. The results of the releasing agent slurry A of example 1 are also shown in Table 2.

is preferred that the amount of silicon dioxide powder to be added is smaller by weight than the amount of silicon nitride powder to be added.

The above examples have established that a method of forming a mold according to the present invention provides good advantages. These examples also have indicated that good solar cell elements can be obtained by producing a silicon ingot with such a mold, slicing the silicon ingot, and using the resultant slices for manufacturing solar cell elements.

Figure 8:
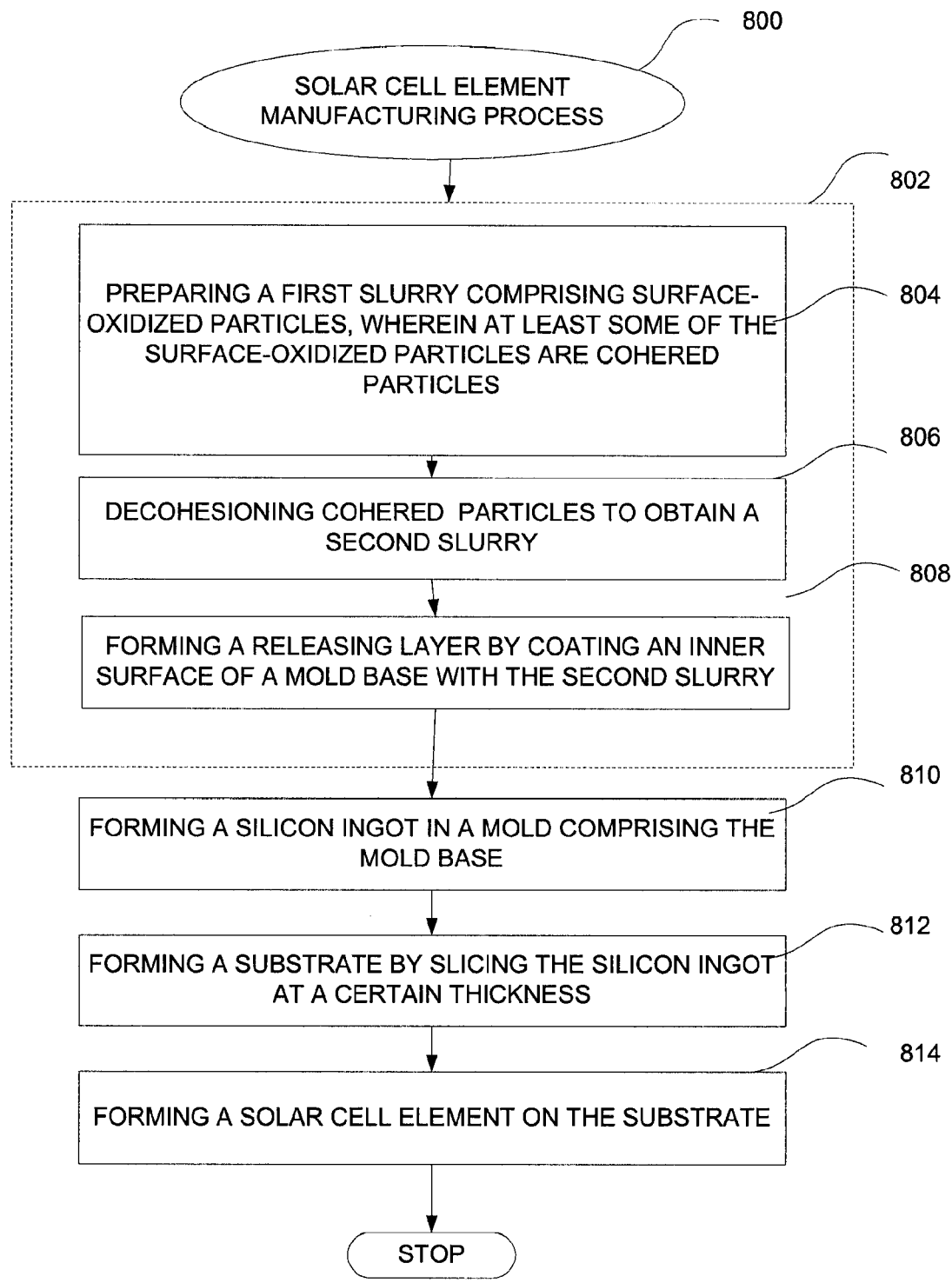
FIG. 8 shows an exemplary flow diagram illustrating a solar cell element manufacturing process.

FIG. 8 illustrates process 800 according to embodiments of the disclosure. The various tasks performed in connection with processes 800 may be performed or controlled by hardware, software, firmware, or any combination thereof. For illustrative purposes, the following description of processes 800 may refer to elements mentioned above in connection with FIGS. 1-7. In practical embodiments, portions of processes 800 may be performed by different elements, e.g., the mold 10 and/or solar cell element 500. Processes 800 may include any number of additional or alternative tasks. The tasks shown in FIG. 8 need not be performed in the illustrated order, and processes 800 may be incorporated into a more comprehensive procedures or processes having additional functionality not described in detail herein. Process 800 may share the same parameters, definition and functionality as explained above in the context of discussion of FIGS. 1-7. Therefore, these definitions and the functionalities are not redundantly explained herein.

TABLE 2

| | Conditions | | | |
| --- | --- | --- | --- | --- |
| | Addition of silicon dioxide powder | Silicon nitride:silicon dioxide (weight ratio) | Proportion of rejected wafers because of foreign matters | Proportion of rejected solar cell elements because of leakage | Adhesion between mold and releasing agent |
| Releasing agent slurry A | None | 10:0 | 0.4% | 0.37% | None |
| Releasing agent slurry E | Conducted | 8:2 | 0.35% | 0.23% | None |
| Releasing agent slurry F | Conducted | 6:4 | 0.33% | 0.24% | None |
| Releasing agent slurry G | Conducted | 5:5 | 0.36% | 0.21% | Slightly occurred |

Table 2 indicates that the proportion of rejected wafers and the proportion of rejected solar cell elements because of leakage were smaller in the cases of using the releasing agent slurries E, F, and G containing silicon dioxide powder than in the case of using the releasing agent slurry A without silicon dioxide powder. No significant differences were observed among the cases of using the releasing agent slurries E, F, and G.

The results indicate that, when a mold is formed with a releasing agent slurry that has been subjected to a disintegration treatment and has subsequently mixed with silicon dioxide powder and a silicon ingot is produced with the mold, the mold has a stronger releasing layer and the occurrence of flaking of the releasing layer and entry of a flaked portion of the releasing layer during production of the silicon ingot is further reduced. In this manner, there are more reliably provided wafers that are not rejected because of foreign matters and solar cell elements that are not rejected because of leakage.

When the releasing agent slurry G, which contained the largest ratio (see Table 2) of silicon dioxide powder, was used, adhesion between the mold base and the releasing agent slightly occurred. Thus, when a graphite mold base is used, it FIG. 8 illustrates a process 800 for manufacturing a solar cell element according to an embodiment of the disclosure. The process 800 may begin by forming a mold 10 (task 802). In this manner, process 800 may prepare a slurry containing surface-oxidized particles comprising oxide layers on surfaces thereof. At least some of the surface-oxidized particles are cohered by bonding of the oxide layers (task 804). The process 800 may continue by decohesioning cohered surface-oxidized particles to obtain a second slurry (task 806). The process 800 may continue by forming the releasing layer by coating the inner surface of the mold base with the slurry (task 808). After the mold 10 is formed (task 802), the process 800 may continue by producing a silicon ingot by solidifying a silicon melt in a mold comprising the mold base and the releasing layer (task 810). The process 800 may then continue by forming a substrate by slicing the silicon ingot at a certain thickness (task 812). The process 800 may continue by forming a solar cell element by forming a diffusion layer in a first surface of the substrate (task 814).

Terms and phrases used in this document, and variations hereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

While at least one exemplary embodiment has been presented in the foregoing detailed description, the present invention is not limited to the above-described embodiment or embodiments. Variations may be apparent to those skilled in the art. In carrying out the present disclosure, various modifications, combinations, sub-combinations and alterations may occur in regard to the elements of the above-described embodiment insofar as they are within the technical scope of the present disclosure or the equivalents thereof. The exemplary embodiment or exemplary embodiments are examples, and are not intended to limit the scope, applicability, or configuration of the disclosure in any way. Rather, the foregoing detailed description will provide those skilled in the art with a template for implementing the exemplary embodiment or exemplary embodiments. It should be understood that various changes can be made in the function and arrangement of elements without departing from the scope of the disclosure as set forth in the appended claims and the legal equivalents thereof. Furthermore, although embodiments of the present disclosure have been described with reference to the accompanying drawings, it is to be noted that changes and modifications may be apparent to those skilled in the art. Such changes and modifications are to be understood as being included within the scope of the present disclosure as defined by the claims.

What is claimed is:

1. A method of forming a mold for producing a silicon ingot, the method comprising:
    surface oxidizing silicon nitride particles;
    preparing a first slurry comprising the surface-oxidized particles, wherein at least some of the surface-oxidized particles are cohered particles through bonds between oxide layers of the surface-oxidized particles;
    eliminating cohesions of the cohered particles in the first slurry by applying an external force to the cohered particles to break the bonds to obtain a second slurry, wherein a particle size of the cohered particles in the second slurry is more than 1 μm and less than 10 μm for 90% of a cumulative distribution of the particle size of the cohered particles in the second slurry; and
    forming a releasing layer by coating an inner surface of a mold base with the second slurry.

2. The method of forming a mold for producing a silicon ingot according to claim 1, wherein the surface oxidized particles comprise silicon nitride ($Si_3N_4$).

3. The method of forming a mold for producing a silicon ingot according to claim 2, wherein the surface-oxidized particles have an oxygen concentration of at least 6% by weight.

4. The method of forming a mold for producing a silicon ingot according to claim 1, wherein the second slurry comprises silicon dioxide ($SiO_2$) particles.

5. The method of forming a mold for producing a silicon ingot according to claim 1, further comprising adding resin beads to the first slurry.

6. The method of forming a mold for producing a silicon ingot according to claim 5, wherein the resin beads comprise at least one of the group consisting of: an ethyl cellulose resin and an acrylic resin.

7. The method of forming a mold for producing a silicon ingot according to claim 5, wherein a size of the resin beads is within a range of about 0.5 μm to about 20 μm.

8. The method of forming a mold for producing a silicon ingot according to claim 5, further comprising a second releasing layer without resin beads.

9. The method of forming a mold for producing a silicon ingot according to claim 5, wherein the resin beads comprise about 1% to 10% of a weight of particles in the first slurry.

10. The method of forming a mold for producing a silicon ingot according to claim 5, wherein the resin beads form fine holes in the releasing layer when heated.

11. The method of forming a mold for producing a silicon ingot according to claim 1, wherein eliminating cohesions of the cohered particles occurs through oscillating milling.

12. A method of forming a mold for producing a silicon ingot, the method comprising:
    surface oxidizing silicon nitride particles;
    preparing a first slurry comprising the surface-oxidized particles, wherein at least some of the surface-oxidized particles are cohered particles through bonds between oxide layers of the surface-oxidized particles, comprising:
        obtaining a solution containing a binder and a solvent;
        adding a first portion of the solution to the surface-oxidized particles to obtain a first mixture;
        agitating the first mixture until the first mixture reaches a predetermined viscosity to obtain an agitated first mixture at the predetermined viscosity;
        adding a second portion of the solution to the agitated first mixture to obtain a second mixture;
        agitating the second mixture to obtain the first slurry at a viscosity within a range of 30 dPa·s to 80 dPa·s;
    eliminating cohesions of the cohered particles in the first slurry by applying an external force to the cohered particles to break the bonds to obtain a second slurry; and
    forming a releasing layer by coating an inner surface of a mold base with the second slurry.

13. The method of forming a mold for producing a silicon ingot according to claim 12, wherein the predetermined viscosity is within a range of 300 dPa·s to 600 dPa·s.

14. A method of manufacturing a solar cell element, the method comprising:
    surface oxidizing the silicon nitride particles;
    preparing a first slurry comprising the surface-oxidized particles, wherein at least some of the surface-oxidized particles are cohered particles through bonds between oxide layers of the surface-oxidized particles, wherein the surface-oxidized particles comprise silicon nitride ($Si_3N_4$);

eliminating cohesions of the cohered particles by applying an external force to the cohered particles to break the bonds to obtain a second slurry, wherein a particle size of the cohered particles in the second slurry is more than 1 μm and less than 10 μm for 90% of a cumulative distribution of the particle size of the cohered particles in the second slurry;

forming a releasing layer by coating an inner surface of a mold base with the second slurry; and producing a silicon ingot by solidifying a silicon melt in a mold comprising the mold base and the releasing layer.

15. The method of manufacturing a solar cell element according to claim 14, wherein the second slurry comprises silicon dioxide ($SiO_2$) particles.

16. The method of manufacturing a solar cell element according to claim 14, further comprising obtaining a substrate by slicing the silicon ingot at a certain thickness.

17. The method of manufacturing a solar cell element according to claim 16, further comprising:

forming a solar cell element by forming a diffusion layer in a first surface of the substrate; and forming a first metal electrode on the first surface.

18. The method of manufacturing a solar cell element according to claim 17, further comprising forming a second metal electrode on a second surface of the substrate.

19. The method of manufacturing a solar cell element according to claim 14, wherein eliminating cohesions of the cohered particles occurs through oscillating milling.

* * * * *